United States Patent
Wong et al.

(10) Patent No.: US 8,239,148 B2
(45) Date of Patent: Aug. 7, 2012

(54) STATE SWITCHING DEVICE FOR SWITCHING STATES OF ELECTRONIC DEVICE BY DETECTING BATTERY VOLTAGE OF THE ELECTRONIC DEVICE AND METHOD THEREOF

(75) Inventors: Shih-Fang Wong, Taipei Hsien (TW); Tsung-Jen Chuang, Taipei Hsien (TW); Lin-Kun Ding, Shenzhen (CN); Jiang-Feng Shan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 818 days.

(21) Appl. No.: 12/336,506

(22) Filed: Dec. 16, 2008

(65) Prior Publication Data
US 2009/0171601 A1    Jul. 2, 2009

(30) Foreign Application Priority Data
Dec. 29, 2007    (CN) .......................... 2007 1 0203568

(51) Int. Cl.
*G01R 31/36*    (2006.01)
*G06F 11/30*    (2006.01)
(52) U.S. Cl. ............... 702/63; 702/64; 702/79; 320/134
(58) Field of Classification Search ............ 702/63, 702/64, 65, 79
See application file for complete search history.

(56) References Cited

U.S. PATENT DOCUMENTS

| | | | |
|---|---|---|---|
| 5,565,853 A * | 10/1996 | Jun-Young | 340/636.15 |
| 7,142,995 B2 * | 11/2006 | Tung | 702/63 |
| 2008/0042622 A1 * | 2/2008 | Wong et al. | 320/162 |
| 2008/0174279 A1 * | 7/2008 | Zhou et al. | 320/160 |

* cited by examiner

*Primary Examiner* — Hal Wachsman
(74) *Attorney, Agent, or Firm* — Altis Law Group, Inc.

(57) ABSTRACT

A state switching device for switching the states of a device by detecting a battery voltage of the device is provided. The device includes a voltage dividing circuit to provide an output voltage in proportion to the battery voltage, and a detection unit which includes a voltage detection module, a comparison module, a control module and a state detection module to obtain the device's state. The voltage detection module produces a digital detection voltage according to the output voltage at normal time intervals, the comparison module detects whether the digital detection voltage is lower than a reference voltage corresponding to the state. If yes, the voltage detection module obtains digital detection voltage at abnormal time intervals. The comparison module compares a predetermined number of digital detection voltages with the reference voltage to produce comparison results. The control module determines whether to maintain the device's state according to the comparison results.

12 Claims, 3 Drawing Sheets

STATE SWITCHING DEVICE FOR SWITCHING STATES OF ELECTRONIC DEVICE BY DETECTING BATTERY VOLTAGE OF THE ELECTRONIC DEVICE AND METHOD THEREOF

BACKGROUND

1. Technical Field

The present disclosure relates to battery detection devices and, particularly, to a battery voltage detection device and method thereof.

2. General Background

Nowadays, handheld devices (e.g., mobile phones, and media players) are more and more popular. These handheld devices are typically powered with a battery pack, which includes one or more cells to form a battery. As is well known, if the battery dies during operation of a handheld device, data currently being edited by the user may be lost. Furthermore, over-discharging a battery can shorten the battery's life. Therefore, handheld devices need to store data before being shut down when the voltage of the battery falls below the minimum operating voltage.

A method usually used to determine over-discharge of a battery in a device is to compare the voltage of the battery with a predetermined voltage, if the voltage of the battery is lower than the predetermined voltage, the battery is determined to be over-discharged.

However, if voltage of the battery should fall below the predetermined level momentarily, the devices will mistake the battery by detection an over-discharge and then shut down the handheld device, which is inconvenient and also may shorten the battery's life.

Accordingly, it is necessary to provide a device to overcome the above-identified deficiencies.

BRIEF DESCRIPTION OF THE DRAWINGS

The components in the drawings are not necessarily drawn to scale, the emphasis instead being placed upon clearly illustrating the principles of the present battery detection device. Moreover, in the drawings, like reference numerals designate corresponding parts throughout the several views.

DETAILED DESCRIPTION OF THE EMBODIMENTS

Figure 1:
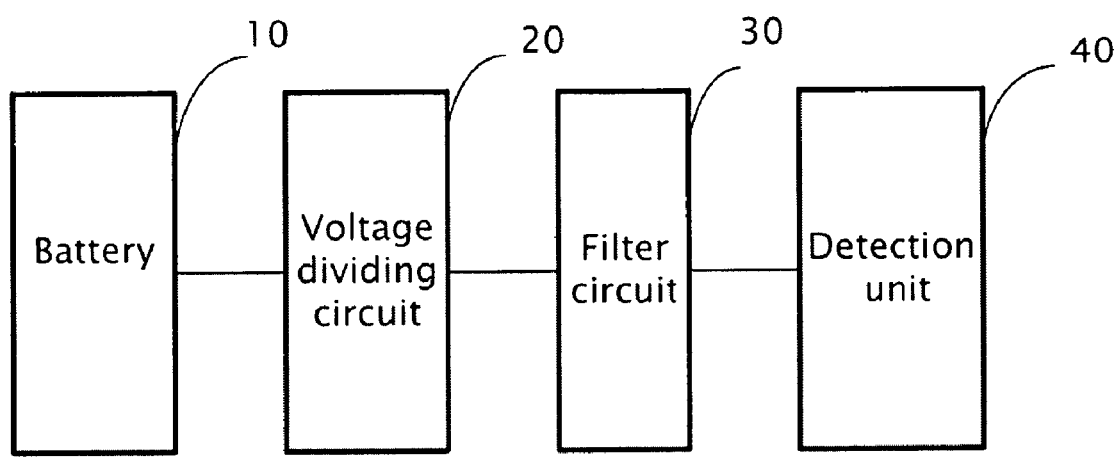
FIG. 1 is a block diagram of a battery detection device in accordance with an exemplary embodiment of the present disclosure.

Referring to FIG. 1, in the battery detection device, a battery 10, a voltage dividing circuit 20, a filter circuit 30, and a detection unit 40 are connected in series. The voltage dividing circuit 20 is configured to detect a voltage of the battery 10, and provide an output voltage in proportion to the voltage of the battery 10. The filter circuit 30 is configured to filter the output voltage provided by the voltage dividing circuit 20 and reduce the noise (i.e., ripple) in the output voltage. The detection unit 40 is configured to determine whether the voltage of the battery falls below a required voltage by comparing the output voltage with a reference voltage, and thus determine whether to maintain a normal work state of an electronic device (not shown) which is powered by the battery 10. The required voltage is a predetermined voltage necessary to maintain the electronic device at the normal work state. The electronic device will be shut down if the voltage of the battery falls below the required voltage. In the exemplary embodiment, the battery detection device is incorporated in the electronic device and the function of the detection unit 40 is achieved by a processing unit (not shown) of the electronic device.

Figure 2:
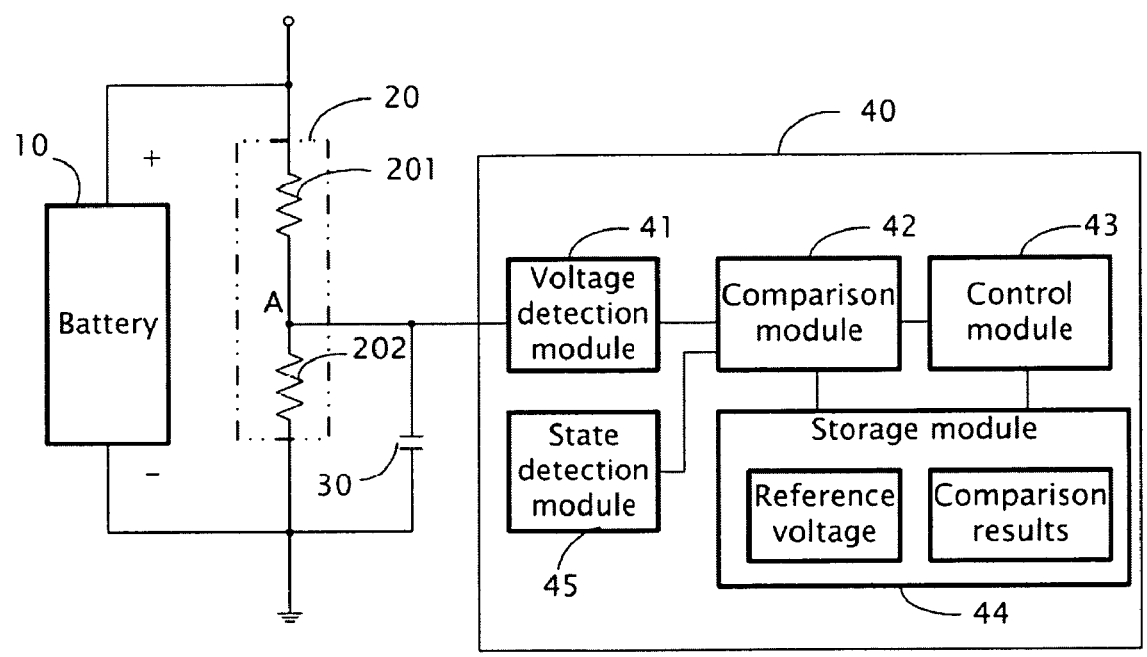
FIG. 2 is a schematic diagram showing an exemplary implementation of FIG. 1.

Referring to FIG. 2, the voltage dividing circuit 20 is connected between the anode terminal and cathode terminal of the battery 10. The voltage dividing circuit 20 includes at least a first resistor 201 and a second resistor 202, connected in series. The first resistor 201 is connected to the anode terminal of the battery 10, and the second resistor 202 is connected to the cathode terminal of the battery 10 and also grounded. A connection node A between the first resistor 201 and the second resistor 202 forms an output port to output the output voltage. The connection node A is connected to the filter circuit 30 and the detection unit 40.

In the exemplary embodiment, the filter circuit 30 is a capacitor 30, connected between the connection node A and ground. When the connection node A outputs voltage, noise in the output voltage is filtered out by the capacitor 30.

The detection unit 40 includes a voltage detection module 41, a comparison module 42, a control module 43, a storage module 44, and a state detection module 45.

The voltage detection module 41 is configured to detect the output voltage and produce a digital detection voltage according to the output voltage. In detail, the voltage detection module 41 detects a value of the output voltage and converts the value of the output voltage into a digital value, which is hereinafter referred to as the "digital detection voltage $V_{TEC}$".

The state detection module 45 is configured to detect a current state of the electronic device. The electronic device may have a plurality of states. To better describe the exemplary embodiment, a mobile phone is taken as an example to illustrate the electronic device. Generally, the mobile phone has a plurality of states such as a state of "standby state", a state of "sending and receiving messages", a state of "communicating with others", a state of "taking photographs", etc. Each state has a corresponding reference voltage $V_{REF}$ stored in the storage module 44. The reference voltage $V_{REF}$ indicates a required voltage to maintain the electronic device in the corresponding state. In the example of the mobile phone, the reference voltages of the states of "standby state", "receiving and sending messages", "communicating with others", and "taking photographs" are correspondingly defined as $V_{NOR}$, $V_{MSN}$, $V_{COM}$, and $V_{CAM}$ and stored in the storage module 44.

The comparison module 42 is configured to compare the digital detection voltage $V_{TEC}$ with the reference voltage $V_{REF}$ corresponding to the current state of the electronic device and produce a comparison result. For example, if the state detection module 45 detects the mobile phone is in the state of "receiving and sending messages", the comparison module 42 obtains the reference voltage $V_{MSN}$ from the storage module 44 and compares the digital detection voltage $V_{TEC}$ with the reference voltage $V_{MSN}$.

The control module 43 is configured to determine whether to maintain the current state of the electronic device according to the comparison results produced by the comparison module 42. For example, if the comparison result indicates that the voltage of the battery 10 is higher than the required voltage, indicating that the battery 10 has enough power to maintain the current state of the electronic device, the control module 43 controls the electronic device to maintain its current state, for example, maintain the "receiving and sending messages" state of the mobile phone if the voltage of battery is higher than the required voltage for this state.

The storage module 44 also stores a plurality of detection cycle parameters and a predetermined number of detection times. The detection cycle parameters are used to determine time intervals between the start of one cycle and the start of the next cycle that the voltage detection module 41 obtains the output voltage and produces the digital detection voltage $V_{TEC}$. The predetermined number of detection times is used to determine the amount that the voltage detection module 41 obtains the output voltage and produces the digital detection voltage $V_{TEC}$. The detection cycle parameters include at least a normal detection cycle parameter and an abnormal detection cycle parameter. The normal cycle parameter defines a relatively longer time interval (e.g., 5 seconds, hereinafter, the normal time interval) to obtain the output voltage and produce the digital detection voltage $V_{TEC}$. The normal cycle parameter is applied in a normal detection mode. The abnormal cycle parameter defines a relatively shorter time interval (e.g., 300 milliseconds, hereinafter, the abnormal time interval) to obtain the output voltage and produce the digital detection voltage $V_{TEC}$. The abnormal cycle parameter and the predetermined number of detection times are applied in an abnormal detection mode.

The voltage detection module 41 obtains value of the output voltage and produces the digital detection voltage in the two modes, i.e., in the normal detection mode and the abnormal detection mode, respectively. The control module 43 is also configured to control the voltage detection module 41 to switch between the normal detection mode and the abnormal detection mode. In the normal detection mode, the voltage detection module 41 obtains the output voltage and produces the digital detection voltage $V_{TEC}$ every normal time interval. In the abnormal detection mode, the voltage detection module 41 obtains the output voltage and produces the digital detection voltage $V_{TEC}$ for the predetermined number of detection times of abnormal time interval.

For example, suppose a mobile phone's current state is "receiving and sending messages". At first, the voltage detection module 41 obtains the output voltage and produces the digital detection voltage $V_{TEC}$ periodically in the normal detection mode, and the comparison module 42 compares the digital detection voltage $V_{TEC}$ with the reference voltage $V_{MSN}$. If the digital detection voltage $V_{TEC}$ is equal to or higher than the reference voltage $V_{MSN}$, which indicates the voltage of the battery is equal to or higher than the required value for the state of "receiving and sending messages", the control module 43 controls the mobile phone to maintain its current state.

If the digital detection voltage $V_{TEC}$ is lower than the reference voltage $V_{MSN}$, which indicates the voltage of the battery 10 may be difficult to maintain the mobile phone in the state of "receiving and sending messages", the control module 43 changes the voltage detection module 41 to the abnormal detection mode. In the abnormal detection mode, the voltage detection module 41 obtains the output voltage and produces the digital detection voltage $V_{TEC}$ for the predetermined number of detection times of the abnormal time interval.

The comparison module 42 compares the detection voltage $V_{TEC}$ with the reference voltage $V_{MSN}$ to produce comparison results and stores the comparison results in the storage module 44. The number of the comparison results is equal to the predetermined number of detection times. Each comparison result reflects that whether the digital detection voltage is equal to or higher than, or lower than, the reference voltage. If a majority of the comparison results reflect that the digital detection voltage $V_{MSN}$ is equal to or higher than the reference voltage, the control module 43 controls the mobile phone to maintain the current state and changes the voltage detection module 41 to the normal detection mode. Otherwise, the control module 43 gives low-battery warnings and automatically stores the data edited by users in the storage module 44 before shutting down the electronic device.

For example, if the predetermined number of detection times is three, the detection module 41 obtains the value of the output voltage for three times and produces three digital detection voltages $V_{TEC}$. The comparison module 42 compares the detection voltages $V_{TEC}$ with the reference voltage $V_{REF}$ to produce three comparison results. If the comparison results reflect that two of the digital detection voltages $V_{TEC}$ are equal to or higher than the reference voltage $V_{REF}$, the control module 43 maintains the current state of the electronic device and changes the voltage detection module 41 to the normal detection mode. If the comparison results reflect that two of the digital detection voltages $V_{TEC}$ are lower than the reference voltage $V_{REF}$, the control module 43 gives low-battery warnings and automatically stores the data edited by the users and shuts the electronic device down.

Figure 3:
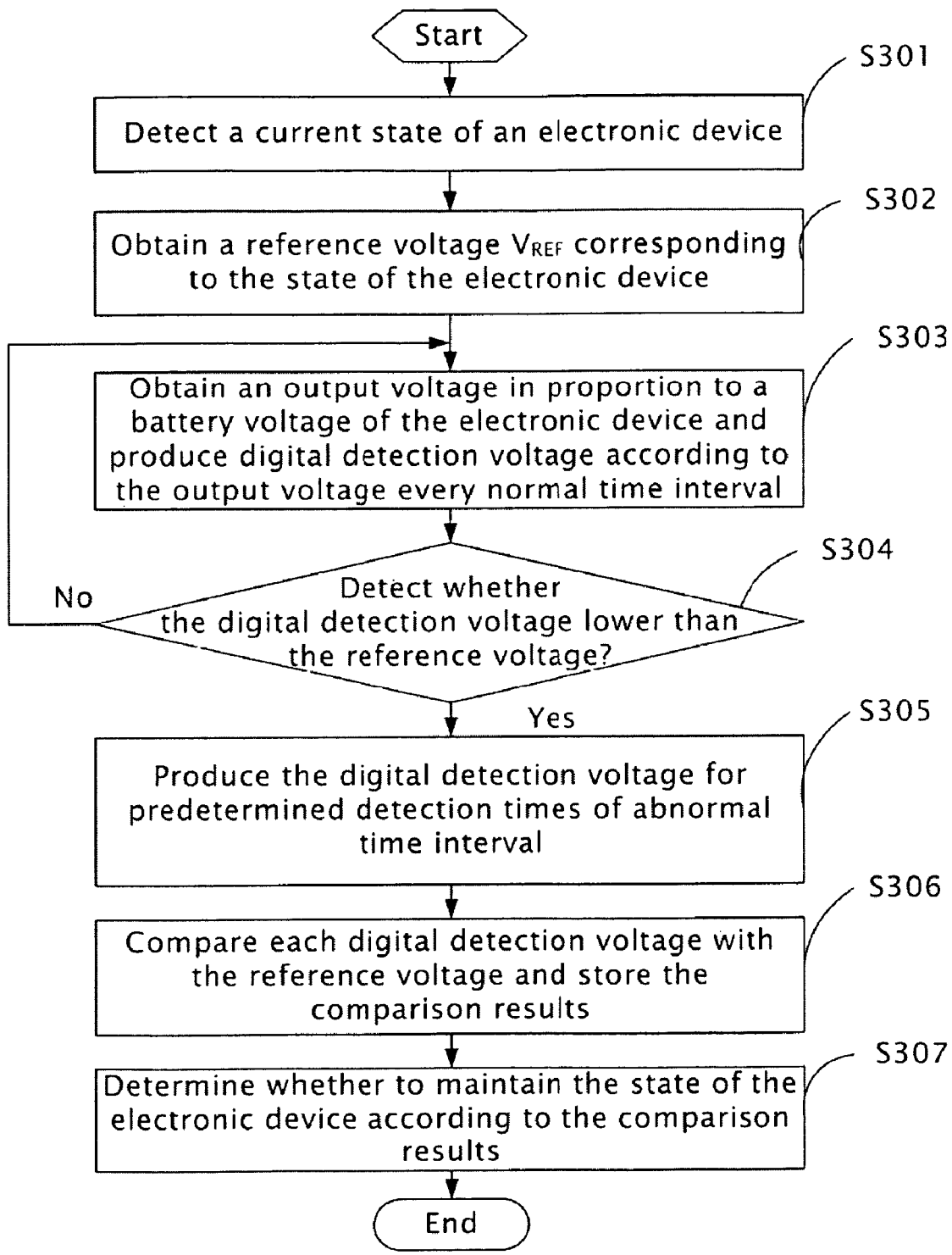
FIG. 3 is a flowchart illustrating a battery detection method in accordance with an exemplary embodiment of the present disclosure.

FIG. 3 is a flowchart illustrating a battery detection method in accordance with an exemplary embodiment of the present invention. In step S301, the state detection module 45 detects a current state of an electronic device.

In step S302, the comparison module 42 obtains a reference voltage $V_{REF}$ corresponding to the current state from the storage module 44.

In step S303, the voltage detection module 41 obtains a value of the output voltage which is proportional to the voltage of the battery 10, converts the output voltage to a digital value which is referred to as a digital detection voltage $V_{TEC}$ and transmits the digital detection voltage $V_{TEC}$ to the comparison module 42 in a normal detection mode. In the normal detection mode, the voltage detection module 41 obtains the value of the output voltage and produces the digital detection voltage every normal time interval.

In step S304, the comparison module 42 compares whether the digital detection voltage $V_{TEC}$ is equal to or higher than the reference voltage $V_{REF}$.

If the digital detection voltage $V_{TEC}$ is equal to or higher than the reference voltage $V_{REF}$, then return to step S304, if the digital detection voltage $V_{TEC}$ is lower than the reference voltage $V_{REF}$, in step S305, the control module 43 controls the voltage detection module 41 to enter an abnormal detection mode. In the abnormal detection mode, the voltage detection module 41 obtains the value of the output voltage and produces the digital detection voltage for the predetermined number of detection times (e.g., three times) of the abnormal time interval. The abnormal time interval is shorter than the normal time interval.

In step S306, the comparison module 42 compares the digital detection voltages $V_{TEC}$ with the reference voltage $V_{REF}$ to produce comparison results and stores the comparison results in the storage module 44.

In step S307, the control module 43 obtains the comparison results from the storage module 44 and determines whether to maintain the current state of the electronic device according to the comparison results.

In detail, if a majority of the comparison results reflect that the digital detection voltages $V_{TEC}$ is lower than the reference voltage $V_{REF}$, the voltage of the battery is taken as abnormal and not enough to run the electronic device. The control module 43 thereby gives low-battery warnings and automatically saves data being edited by the user and shuts the electronic device down. Otherwise, the control module 43 controls the electronic device to maintain its current state.

The function of the detection unit 40 may be executed by a processing unit in the electronic device. Therefore there is no need to add a new processing unit. The processing unit can be a digital signal processor or other processing chips.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A state switching device for switching states of an electronic device by detecting a battery voltage of the electronic device, the state switching device comprising:
    a voltage dividing circuit configured to detect the battery voltage and provide an output voltage in proportion to the battery voltage; and
    a detection unit comprising:
        a storage module configured to store detection cycle parameters, predetermined detection times and at least one reference voltage corresponding to at least one state of the electronic device respectively, the detection cycle parameters defining a normal time interval and an abnormal time interval;
        a voltage detection module working in a normal detection mode or an abnormal detection mode, the voltage detection module being configured to obtain and convert the output voltage to a digital detection voltage at the normal time intervals in the normal detection mode, and obtain and convert the output voltage to the digital detection voltage at the abnormal time intervals in the abnormal detection mode;
        a comparison module configured to respectively compare the digital detection voltage produced in the normal detection mode with a reference voltage corresponding to a current state of the electronic device and a predetermined number of digital detection voltages produced in the abnormal detection mode with the reference voltage corresponding to the current state of the electronic device to produce comparison results; and
        a control module configured to control the voltage detection module to enter the abnormal detection mode when the comparison result reflects that the detection voltage produced in the normal detection mode is lower than the reference voltage corresponding to the current state of the electronic device; and further configured to maintain the current state of the electronic device when a majority of comparison results reflect that the digital detection voltage produced in the abnormal detection mode is equal to or higher than the reference voltage corresponding to the current state of the electronic device.

2. The state switching device of claim 1, wherein the control module is configured to maintain the current state of the electronic device when among the comparison results produced by comparing the predetermined number of digital detection voltages produced in the abnormal detection mode with the reference voltage, those comparison results reflecting that the digital detection voltage is equal to or higher than the reference voltage corresponding to the current state of the electronic device exceed those comparison results reflecting that the digital detection voltage is lower than the reference voltage corresponding to the current state of the electronic device.

3. The state switching device of claim 2, wherein the control module is further configured to give low-battery warnings and automatically store data being edited by users before shutting down the electronic device when among the comparison results produced by comparing the predetermined number of digital detection voltages produced in the abnormal detection mode with the reference voltage, those comparison results reflecting that the digital detection voltage is lower than the reference voltage corresponding to the current state of the electronic device exceed those comparison results reflecting that the digital detection voltage is equal to or higher than the reference voltage corresponding to the current state of the electronic device.

4. The state switching device of claim 3, wherein the detection unit further comprises a state detection module configured to obtain the current state of the electronic device, the current state corresponding to a reference voltage pre-stored in the storage module.

5. The state switching device of claim 1, wherein the abnormal time interval is relatively shorter than the normal time interval.

6. The state switching device of claim 1, wherein the voltage dividing circuit comprises a first resistor and a second resistor which serially connected between an anode terminal of the battery and a cathode terminal of the battery, the output voltage is provided by a connection node of the first resistor and the second resistor.

7. The state switching device of claim 6, wherein the state switching device further comprises a filter circuit configured to filter out noise from the output voltage.

8. The state switching device of claim 7, wherein the filter circuit comprises a capacitor which is connected between the connection node of the voltage dividing circuit and ground.

9. The state switching device of claim 1, wherein the detection unit is incorporated in a processing unit of the electronic device.

10. A method for switching states of an electronic device by detecting a battery voltage of the electronic device, the electronic device comprising a voltage dividing circuit for detecting the battery voltage and providing an output voltage in proportion to the battery voltage, the electronic device having a plurality of states, each state having a corresponding reference voltage stored in a storage module of the electronic device, the method comprising:
    detecting a current state of the electronic device;
    obtaining a reference voltage corresponding to the current state of the electronic device from the storage module;
    obtaining an output voltage in proportion to the battery voltage from the voltage dividing circuit;
    converting the output voltage to a digital detection voltage at normal time intervals in a normal detection mode;
    determining whether the digital detection voltage is lower than the reference voltage;
    obtaining the output voltage and converting the output voltage to the digital detection voltage at abnormal time intervals in an abnormal detection mode when the digital detection voltage is lower than the reference voltage;
    comparing a predetermined number of digital detection voltages with the reference voltage to produce comparison results; and
    maintaining the current state of the electronic device when a majority of comparison results reflect that the digital detection voltage is equal to or higher than the reference voltage.

11. The method of claim 10, wherein maintaining the current state of the electronic device when among the comparison results those comparison results reflecting that the digital detection voltage is equal to or higher than the reference voltage exceed those comparison results reflecting that the digital detection voltage is lower than the reference voltage.

12. The method of claim 11, further comprising giving low-battery warnings, storing data being edited by users automatically and shutting down the electronic device when among the comparison results, those comparison results reflecting that the digital detection voltage is lower than the reference voltage exceed those comparison results reflecting that the digital detection voltage is equal to or higher than the reference voltage.

* * * * *